US009996004B2

(12) United States Patent
Smith et al.

(10) Patent No.: US 9,996,004 B2
(45) Date of Patent: Jun. 12, 2018

(54) EUV PHOTOPATTERNING OF VAPOR-DEPOSITED METAL OXIDE-CONTAINING HARDMASKS

(71) Applicant: Lam Research Corporation, Fremont, CA (US)

(72) Inventors: David Smith, Lake Oswego, OR (US); Dennis M. Hausmann, Lake Oswego, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 125 days.

(21) Appl. No.: 14/948,109

(22) Filed: Nov. 20, 2015

(65) Prior Publication Data

US 2017/0146909 A1    May 25, 2017

(51) Int. Cl.
*G03F 7/004* (2006.01)
*G03F 7/16* (2006.01)
*G03F 7/20* (2006.01)
*H01L 21/027* (2006.01)
*G03F 7/32* (2006.01)

(52) U.S. Cl.
CPC .......... *G03F 7/2004* (2013.01); *G03F 7/0042* (2013.01); *G03F 7/0043* (2013.01); *G03F 7/167* (2013.01); *G03F 7/32* (2013.01); *G03F 7/70033* (2013.01); *G03F 7/70991* (2013.01); *H01L 21/0274* (2013.01)

(58) Field of Classification Search
CPC .... G03F 7/0042; G03F 7/0043; G03F 7/2004; G03F 7/70033; G03F 7/70991; G03F 7/167; H01L 21/0274
USPC ...................................... 430/270.1, 325, 326
See application file for complete search history.

(56) References Cited

U.S. PATENT DOCUMENTS

| | | | |
|---|---|---|---|
| 3,513,010 A | 5/1970 | Notley | |
| 3,529,963 A | 9/1970 | Marchese | |
| 3,720,515 A | 3/1973 | Stanley | |
| 4,328,298 A | 5/1982 | Nester | |
| 5,077,085 A | 12/1991 | Schnur et al. | |
| 5,534,312 A | 7/1996 | Hill et al. | |
| 6,162,577 A | 12/2000 | Felter et al. | |
| 6,261,938 B1 | 7/2001 | Beauvais et al. | |
| 9,023,731 B2 | 5/2015 | Ji et al. | |
| 9,551,924 B2 | 1/2017 | Burkhardt et al. | |
| 9,778,561 B2 | 10/2017 | Marks et al. | |
| 2004/0113087 A1 | 6/2004 | Ikeda et al. | |
| 2004/0175631 A1 | 9/2004 | Crocker et al. | |
| 2004/0191423 A1 | 9/2004 | Ruan et al. | |
| 2005/0208389 A1 | 9/2005 | Ishibashi et al. | |
| 2005/0253077 A1 | 11/2005 | Ikeda et al. | |
| 2006/0001064 A1 | 1/2006 | Hill et al. | |
| 2006/0068173 A1 | 3/2006 | Kajiyama et al. | |
| 2006/0147818 A1 | 7/2006 | Lee | |
| 2006/0175558 A1 | 8/2006 | Bakker et al. | |
| 2007/0181816 A1 | 8/2007 | Ikeda et al. | |
| 2009/0208880 A1 | 8/2009 | Nemani et al. | |
| 2010/0197135 A1 | 8/2010 | Ishizaka | |
| 2011/0104595 A1 | 5/2011 | Hayashi et al. | |
| 2012/0088369 A1* | 4/2012 | Weidman ............. | G03F 7/0752 438/703 |
| 2014/0170563 A1 | 6/2014 | Hatakeyama | |
| 2014/0170853 A1 | 6/2014 | Shamma et al. | |
| 2014/0268082 A1* | 9/2014 | Michaelson ............ | G03F 7/167 355/67 |
| 2015/0221519 A1 | 8/2015 | Marks et al. | |
| 2016/0314964 A1 | 10/2016 | Tang et al. | |
| 2017/0102612 A1* | 4/2017 | Meyers ................ | C09D 7/1233 |
| 2018/0004083 A1 | 1/2018 | Marks et al. | |

FOREIGN PATENT DOCUMENTS

JP       2003-213001 A      7/2003
TW       201241555 A1      10/2012

OTHER PUBLICATIONS

U.S. Office Action, dated Jan. 23, 2017, issued in U.S. Appl. No. 14/610,038.
U.S. Final Office Action, dated May 11, 2017, issued in U.S. Appl. No. 14/610,038.
Chinese First Office Action dated May 24, 2017 issued in Application No. CN 201510053668.7.
Fan, Y. et al., (2016) "Benchmarking Study of EUV Resists for NXE:3300B," *Proc. of SPIE*, 9776:97760W-1 to 97760W-11 [Downloaded From http://proceedings.spiedigitallibrary.org/ on Mar. 30, 2017].
Gangnaik, A.S. et al., (2017) "New Generation Electron Beam Resists: A Review," *Chem. Mater.*, 29:1898-1917.
McGinniss, Vincent D., (1978) "Light Sources," Edited by: Pappas, S. Peter, *UV Curing: Science and Technology*; technology marketing corporation, 642 Westover Rd., Stamford, CT, USA; pp. 96-129.
U.S. Appl. No. 15/432,634, filed Feb. 14, 2017, Smith et al.
U.S. Appl. No. 15/495,701, filed Apr. 24, 2017, Smith et al.
Coons, R.W. et al., "Comparison of EUV spectral and ion emission features from laser-produced Sn and Li plasmas," Extreme Ultraviolet (EUV) Lithography, Proc. of SPIE vol. 7636, 73636-1 (2010).
Spitzer, R.C. et al. "Conversion efficiencies from laser-produced plasmas in the extreme ultraviolet region," 79 J. Appl. Phys., 2251 (1996).
Gerritsen, H.C. et al., "Laser-generated plasma as soft x-ray source," J. Appl. Phys. 59 2337 (1986).
U.S. Appl. No. 14/692,627, "Gap fill using carbon-based films," Tang et al., filed Apr. 21, 2015.
U.S. Notice of Allowance, dated Aug. 22, 2017, issued in U.S. Appl. No. 14/610,038.
Fujifilm Corp., (Presentation) "Negative tone development process for double patterning," 5th International Symposium on Immersion Lithography, Sep. 2008, Presentation Slides No. P-1-P-27.

(Continued)

*Primary Examiner* — John A McPherson
(74) *Attorney, Agent, or Firm* — Weaver Austin Villeneuve & Sampson, LLP

(57) ABSTRACT

A vacuum-integrated metal oxide-containing hardmask formation process and related vacuum-integrated hardware that combine steps of film formation by vapor deposition and optical lithography results in direct photopatterning of metal oxide-containing hardmasks at substantially reduced cost relative to current approaches.

20 Claims, 4 Drawing Sheets

(56) References Cited

OTHER PUBLICATIONS

Fujifilm Corp., (Safety Data Sheet) Name of Substance: n-Butyl acetate; Trade Name of Substance: FN-DP001 Ultra Pure Developer, Revision Date : Nov. 25, 2013, MSDS file: 16328_GB_EN_V2.0, pp. 1-9.

Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] <URL: http:dx.doi.org/10.7567/APEX.7.016501>.

Second Office Action, dated Feb. 28, 2018, issued in Chinese Application No. CN 201510053668.7.

* cited by examiner

EUV PHOTOPATTERNING OF VAPOR-DEPOSITED METAL OXIDE-CONTAINING HARDMASKS

BACKGROUND

This disclosure relates generally to the field of semiconductor processing. In particular, the disclosure is directed to processes for forming metal oxide-containing hardmask for EUV patterning.

Patterning of thin films in semiconductor processing is often a critical step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution. One such approach is direct patterning of a photosensitive film, sometimes referred to as a EUV resist, with extreme ultraviolet (EUV) radiation.

SUMMARY

Typical current EUV resists are polymer-based chemically amplified resists (CARs). Improvements in CARs have been made by reducing resist blur (acid diffusion) and pattern collapse by using thin films with high surface adhesion and structural integrity. Thin CARs, however, dictate process window and complexity necessitating the use of additional layers to support multi-step pattern transfer.

An alternative to CARs are directly photopatternable metal oxide films. Currently such films are produced by spin-on techniques, and consume a significant amount of complex metal cluster precursors, resulting in very high cost.

Aspects of the present disclosure are directed to methods and apparatuses for direct EUV photopatterning of vapor-deposited metal oxide-containing hardmasks. Such methods and apparatuses can provide sub-30 nm patterning resolution. The metal oxide-containing film is patterned directly (i.e., without the use of a separate photoresist) by EUV exposure in a vacuum ambient. For example, the EUV exposure of the patterning is conducted using EUV lithography. The method, and associated apparatus, greatly reduces the amount of hardmask precursor required and also enables the use of simpler precursors resulting a net lower cost relative to CARs.

In one implementation, a EUV-sensitive metal oxide-containing film is vapor-deposited on a semiconductor substrate. The metal oxide-containing film is then patterned directly by EUV exposure in a vacuum ambient, and the pattern is developed to form the metal oxide-containing hardmask. In this way, a metal oxide-containing hardmask formation process that combines steps of film formation by vapor deposition and optical lithography with the result of direct photopatterning of metal oxide-containing hardmasks at substantially reduced cost is provided. In another aspect, vacuum-integrated hardware is provided for implementation of such a process.

In various embodiments, the vapor deposition may be conducted by CVD or ALD. The metal oxide-containing film may be a photosensitive metalorganic oxide film, such as an organotin oxide, for example a halo alkyl Sn, alkoxy alkyl Sn or amido alkyl Sn. Some specific examples of suitable precursors include trimethyl tin chloride, dimethyletin dichloride, methyltin trichloride, tris(dimethylamino) methyl tin(IV) and (dimethylamino)trimethyl tin(IV). The deposition may include a reaction of an organotin oxide with carbon dioxide in a RF plasma, for example $CH_3Sn(SnO)_3$ formed by CVD of $Sn(Cl)_3CH_3$ with carbon dioxide in a RF plasma.

In various embodiments, the EUV exposure causes a dimerization reaction in the exposed portion of a deposited organotin oxide film, for example, the deposited organotin oxide film may be $CH_3Sn(SnO)_3$ and the dimerization upon EUV exposure may produce $Sn_2((SnO)_3)_2$ in the exposed portion. In various embodiments, the exposing provides patterning of the metal oxide-containing film directly by EUV exposure in a vacuum ambient, without the use of photoresist, followed by developing to form the metal oxide-containing hardmask.

In the development, the exposed or unexposed portion of the metal oxide-containing film is removed. The substrate may be transferred outside the vacuum ambient to conduct the pattern development. For example, a $Sn_2((SnO)_3)_2$ exposed portion may be removed outside the vacuum ambient by hot ethanol and water in the development.

In another implementation, an apparatus for conducting metal oxide-containing hardmask formation can provide the vacuum integration to conduct the described processes. The apparatus includes a metal oxide-containing film vapor deposition module, a metal oxide-containing film patterning module, and a vacuum transfer module connecting the deposition module and the patterning module. The vapor deposition module may include a reactor chamber for vapor depositing a photosensitive organotin oxide film, such as a PECVD tool. The patterning module may include a photolithography tool with a source of sub-30 nm wavelength radiation such as a EUV lithography tool.

The apparatus can further include a controller including instructions for conducting metal oxide-containing hardmask formation. The instructions include code for: in the metal oxide-containing film vapor deposition module, vapor depositing on a semiconductor substrate a EUV-sensitive metal oxide-containing film; transferring the substrate under vacuum to the metal oxide-containing film patterning module; in the metal oxide-containing film patterning module, patterning the metal oxide-containing film directly by EUV exposure in a vacuum ambient; and developing the pattern to form the metal oxide-containing hardmask. The instructions can further include code for transferring the substrate outside the EUV lithography tool to conduct the pattern development.

These and other features and advantages of the disclosure will be described in more detail below with reference to the associated drawings.

DETAILED DESCRIPTION

Figure 1A:
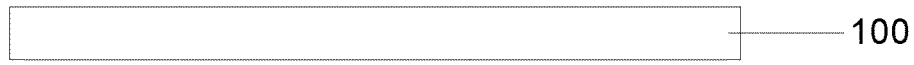
FIGS. 1A-D illustrate a representative process flow for a vapor-deposited metal oxide-containing hardmask formation process.

Reference will now be made in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Introduction

Extreme ultraviolet (EUV) lithography can extend lithographic technology beyond its optical limits by moving to smaller imaging source wavelengths achievable with current photolithography methods to pattern small critical dimension features. EUV light sources at approximately 13.5 nm wavelength can be used for leading-edge lithography tools, also referred to as scanners. The EUV radiation is strongly absorbed in a wide range of solid and fluid materials including quartz and water vapor, and so operates in a vacuum.

EUV lithography typically makes use of an organic hardmask (e.g., an ashable hardmark of PECVD amorphous hydrogenated carbon) that is patterned using a conventional photoresist process. During photoresist exposure, EUV radiation is absorbed in the resist and in the substrate below, producing highly energetic photoelectrons (about 100 eV) and in turn a cascade of low-energy secondary electrons (about 10 eV) that diffuse laterally by several nanometers. These electrons increase the extent of chemical reactions in the resist which increases its EUV dose sensitivity. However, a secondary electron pattern that is random in nature is superimposed on the optical image. This unwanted secondary electron exposure results in loss of resolution, observable line edge roughness (LER) and linewidth variation in the patterned resist. These defects are replicated in the material to be patterned during subsequent pattern transfer etching.

Unlike an insulator such as photoresist, a metal oxide-containing material is less susceptible to secondary electron exposure effects since the secondary electrons can quickly lose energy and thermalize by scattering with conduction electrons. However, electron scattering in the photoresist used to pattern a blanket metal film into a mask would still lead to unacceptable effects such as LER.

As noted above, typical current metal oxide-containing EUV resists are polymer-based chemically amplified resists (CARs) produced by liquid-based spin-on techniques that consume a significant amount of complex metal cluster precursors at very high cost.

As described herein, vapor deposited metal oxide-containing films, such as organotin oxides deposited by CVD or ALD, have been found to be particularly suitable for direct EUV photopatterning. In one implementation, a EUV-sensitive metal oxide-containing film is vapor-deposited on a semiconductor substrate. The metal oxide-containing film is then patterned directly by EUV exposure in a vacuum ambient, and the pattern is developed to form the metal oxide-containing hardmask. In this way, a metal oxide-containing hardmask formation process that combines steps of film formation by vapor deposition and optical lithography with the result of direct photopatterning of metal oxide-containing hardmasks at substantially reduced cost is provided.

In various embodiments, the vapor-based deposition process (e.g., CVD or ALD) may be carried out in a PECVD tool, such as the Lam Vector® can be used to form a thin film of a metal-oxide containing film, such a photosensitive metal-oxide containing organic compound (organometallic oxide compound), with a strong absorption in the EUV (e.g., at wavelengths on the order of 10-20 nm), for example at the wavelength of the EUVL light source (e.g., 13.5 nm=91.8 eV). This photopatterning forms a metal-oxide containing mask that is the pattern transfer layer during subsequent etching (e.g., in a conductor etch tool, such as the Lam 2300® Kiyo®).

In some embodiments, the deposition can be conducted in a chamber integrated with a lithography platform (e.g., a wafer stepper such as the TWINSCAN NXE: 3300B® platform supplied by ASML of Veldhoven, NL) and transferred under vacuum so as not to react before exposure. Integration with the lithography tool is facilitated by the fact that EUVL also requires a greatly reduced pressure given the strong optical absorption of the incident photons by ambient gases such as $H_2O$, $O_2$, etc.

Vapor-Deposited Metal Oxide-Containing Hardmask Formation

FIGS. 1A-D illustrate a representative process flow for a vapor-deposited metal oxide-containing hardmask formation process. Generally, an EUV-sensitive metal oxide-containing film, such that the film can be patterned by EUV exposure, is deposited on a semiconductor substrate. The metal-containing film is then patterned directly (i.e., without the use of a photoresist) by EUV exposure followed by pattern development to form the metal oxide-containing mask. This description references primarily metal oxide-containing films, particularly where the metal is Sn, for example organotin oxide films, that are patterned by extreme ultraviolet lithography (EUV lithography (EUVL)), particularly EUVL having a EUV source which uses excited Sn droplets. Such films are referred to herein as EUV-sensitive films. However, it should be understood that other implementations are possible, including different metal-containing films.

Figure 2:
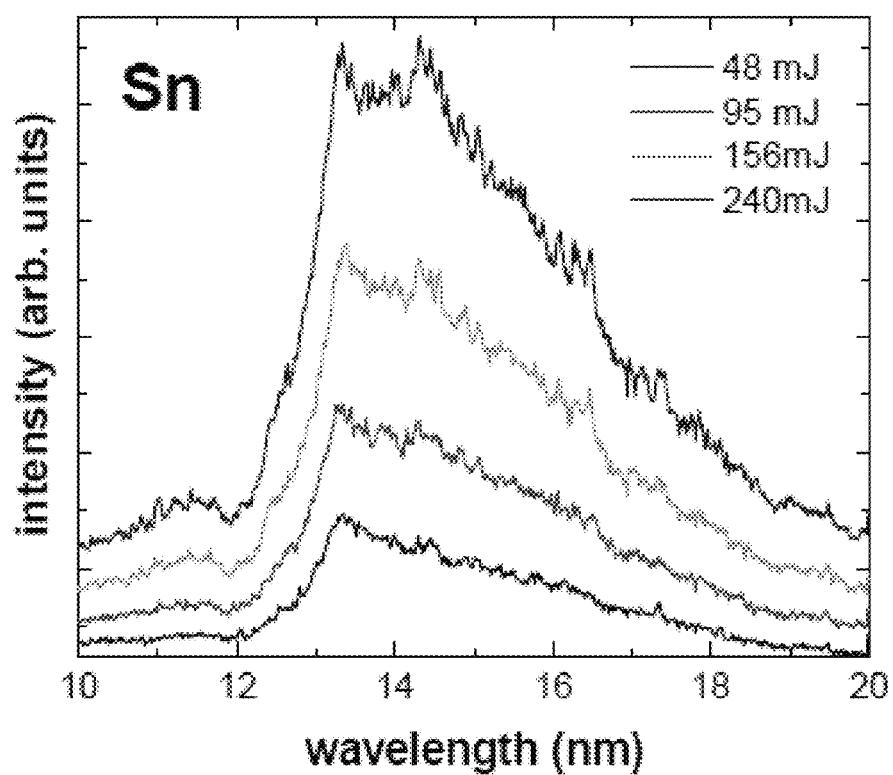
FIG. 2 provides the emission spectrum of a EUV source which uses excited Sn droplets.

A desirable hardmask metal will be a strong absorber and will have a relatively broad absorption profile, high melting point, low malleability/high physical stability and be readily deposited. For the purposes of this disclosure, it is important to note that a material that emits a photon of a given energy will also absorb a photon of that energy. Strongly absorbed light will result in the desired decomposition or will otherwise sensitize the film so that the exposed areas can be removed with heat, wet chemistry, etc. FIG. 2 provides the emission spectrum of a EUV source which uses excited Sn droplets. See, R. W. Coons, et al., "Comparison of EUV spectral and ion emission features from laser produced Sn and Li plasmas", Proc. Of SPIE Vol. 7636 73636-1 (2010); R. C. Spitzer, et al., "Conversion efficiencies from laser-produced plasmas in the extreme ultraviolet region", 79 J. Appl. Phys., 2251 (1996); and H. C. Gerritsen, et al., "Laser-generated plasma as soft x-ray source", J. Appl. Phys. 59 2337 (1986), incorporated herein by reference for their disclosure relating to the emission/absorption properties of various metals. The emitted photons are on the order of 13.5 nm or 91.8 eV. Therefore, Sn is a desirable hardmask metal for this application.

Referring to FIG. 1A, a semiconductor substrate to be patterned 100 is shown. In a typical example, the semiconductor substrate 100 is a silicon wafer including partially-formed integrated circuits.

Figure 1B:

FIG. 1B illustrates a EUV-sensitive metal oxide-containing film 102 vapor deposited on the semiconductor substrate 100. In general, prior to the deposition, the semiconductor substrate 100 is placed in a reactor chamber for metal oxide-containing film vapor deposition under vacuum. The vapor deposition may be conducted by CVD or ALD. The metal oxide-containing film may be a photosensitive metalorganic oxide film, such as an organotin oxide, for example a halo alkyl Sn, alkoxy alkyl Sn or amido alkyl Sn. Some specific examples of suitable precursors include trimethyl tin chloride, dimethyletin dichloride, methyltin trichloride, tris (dimethylamino)methyl tin(IV) and (dimethylamino)trimethyl tin(IV). Films may be deposited by PECVD or PEALD, for example using a Lam Vector® tool, separating the Sn oxide precursor from O precursor/plasma in the ALD implementation. Deposition temperature may be between 50° C. and 600° C. Deposition pressure can vary between 100 and 6000 mtorr. Precursor liquid flow rates for metal oxide-containing film, e.g., organotin oxide precursors, can be between 0.01 and 10 ccm and gas flow rates ($CO_2$, CO, Ar, $N_2$) between 100 and 10000 sccm. Plasma powers can be between 200 and 1000 W per 300 mm wafer station, using a high frequency plasma (e.g., 13.56 MHz, 27.1 MHz, or higher). Deposited thicknesses can be between 100 and 2000 Å.

In one implementation, a blanket of the metal oxide-containing film 102 can be formed by deposition from a suitable precursor in a plasma enhanced chemical vapor deposition (PECVD) reactor, such as a Vector® CVD tool, available from Lam Research Corporation, Fremont, Calif.). For example, the deposition may include a reaction of an organotin oxide with carbon dioxide in a RF plasma, such as $CH_3Sn(SnO)_3$ formed by CVD of $Sn(Cl)_3CH_3$ with carbon dioxide in a RF plasma. Suitable process conditions for this deposition include a deposition temperature between about 250° C. and 350° C., for example about 350° C., and a reactor pressure of less than 6 Torr, for example maintained between 1.5 and 2.5 Torr at 350° C., plasma power/bias of 200 W per 300 mm station using a high frequency plasma (e.g., 13.56 MHz or higher), an organotin oxide precursor flow rate between about 100 and 500 ccm and a $CO_2$ flow rate between about 1000 and 2000 sccm. Deposited thicknesses can be between about 250 and 750 Å.

To prevent degradation due to water vapor, formation and transfer of the tin oxide-containing films is conducted in a vacuum-ambient. The formed film is then transferred to a EUV patterning tool and patterned via direct exposure, without the use of a photoresist, and developed, as illustrated in FIGS. 1C-D.

It should be noted that a EUVL tool typically operates at a higher vacuum than a deposition tool. If this is the case, it is desirable to increase the vacuum environment of the substrate during the transfer from the deposition to the patterning tool to allow the substrate and deposited metal oxide-containing film to degas prior to entry into the patterning tool. This is so that the optics of the patterning tool do not become contaminated by off-gassing from the substrate.

Figure 1C:
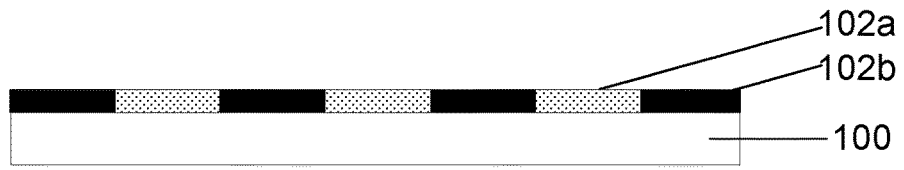

As shown in FIG. 1C, the patterning results in unexposed metal-oxide containing film regions 102a and exposed regions 102b of material, one of which is to be removed by pattern development. In various embodiments, the EUV exposure causes a dimerization reaction in the exposed portion of a deposited organotin oxide film. For example, a deposited organotin oxide film may be $CH_3Sn(SnO)_3$ and the dimerization upon EUV exposure may produce $Sn_2((SnO)_3)_2$ in the exposed portion. In various embodiments, the exposing provides patterning of the metal oxide-containing film directly by EUV exposure in a vacuum ambient, without the use of photoresist, followed by developing to form the metal oxide-containing hardmask.

Figure 1D:
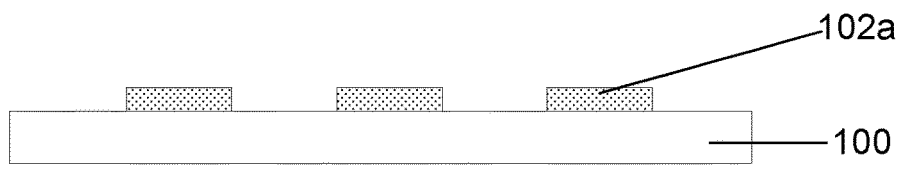

Referring to FIG. 1D, after EUV exposure, the pattern can then be developed. The substrate may be transferred outside the vacuum ambient to conduct the pattern development. For example, a $Sn_2((SnO)_3)_2$ exposed portion 102b may be removed outside the vacuum ambient by hot ethanol and water in the development. It may be desirable to conduct the pattern development outside the patterning tool to avoid contaminating the tool optics with any incompatible byproducts of the metal oxide-containing film decomposition.

Figure 3:
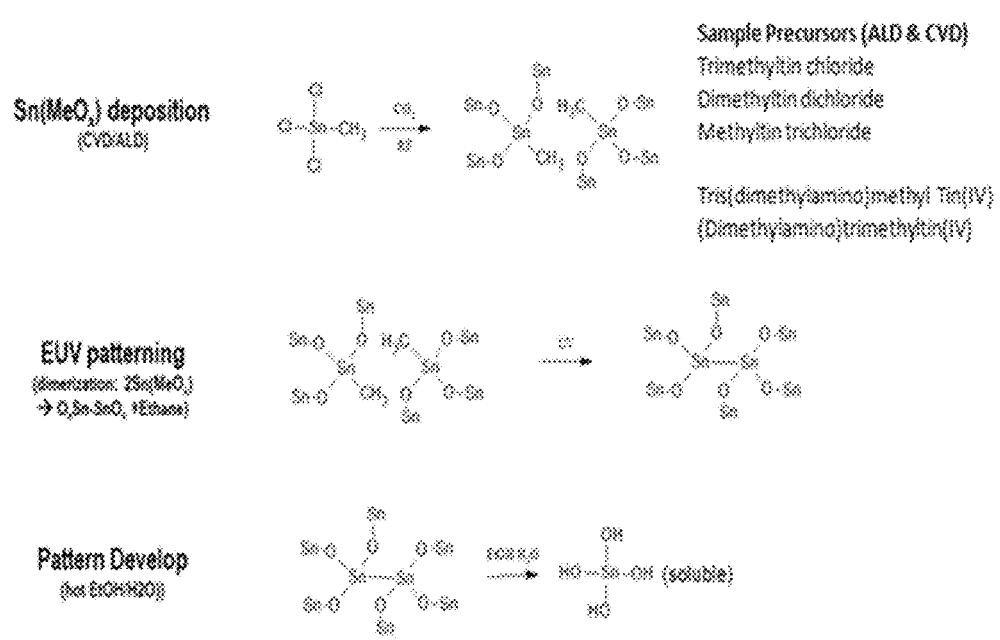
FIG. 3 illustrates the chemistry for embodiments of the disclosed deposition, exposure/patterning and development processes, including sample precursors and associated reactions.

The chemistry of these deposition, exposure/patterning and development processes, including sample precursors and associated reactions, is illustrated in FIG. 3.

Apparatus

Figure 4:
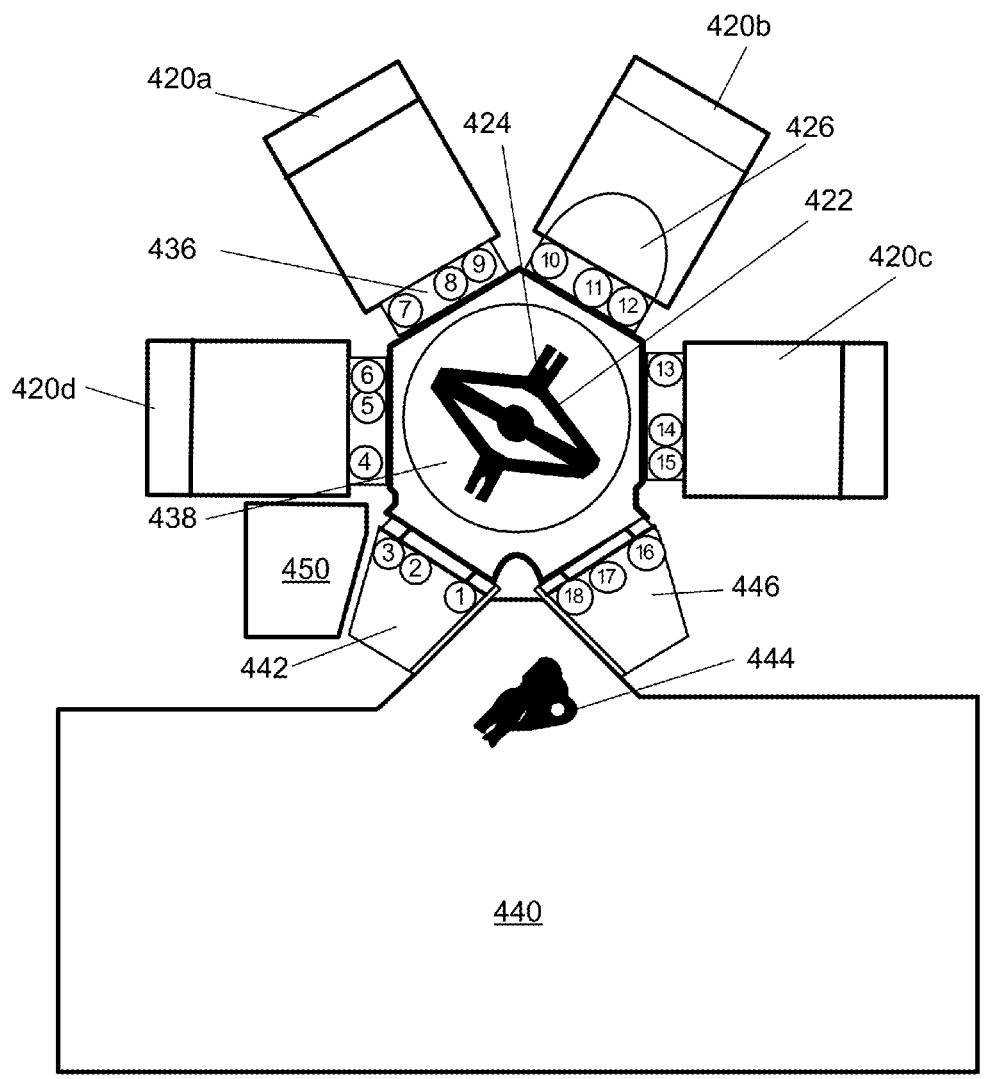
FIG. 4 depicts a semiconductor process cluster architecture with vapor deposition and patterning modules that interface with a vacuum transfer module, suitable for implementation of the processes described herein in a vacuum-integrated apparatus.

FIG. 4 depicts a semiconductor process cluster tool architecture with vacuum-integrated metal oxide-containing film vapor deposition and patterning modules that interface with a vacuum transfer module, suitable for implementation of the processes described herein. While the processes may be conducted without such vacuum integrated apparatus, such apparatus may be advantageous in some implementations.

The arrangement of transfer modules to "transfer" wafers among multiple storage facilities and processing modules of the tool may be referred to as a "cluster tool architecture" system. Metal oxide-containing film deposition and patterning modules are vacuum-integrated, in accordance with a particular process. A vacuum transport module (VTM) 438 interfaces with four processing modules 420a-420d, which may be individually optimized to perform various fabrication processes. By way of example, processing modules 420a-420d may be implemented to perform condensation, deposition, evaporation, ELD, etch, and/or other semiconductor processes. For example, module 420a may be a PECVD reactor, such as a Vector® tool, available from Lam Research Corporation, Fremont, Calif. suitable for conducting CVD deposition of metal oxide-containing films, as described herein. And module 420b may be a PEALD tool, such as the Lam Vector® ALD Oxide tool suitable for conducting ALD deposition of metal oxide-containing films, as described herein. It should be understood that the figure is not necessarily drawn to scale.

Airlocks 442 and 446, also known as a loadlocks or transfer modules, interface with the VTM 438 and a patterning module 440. For example, a suitable patterning module may be the TWINSCAN NXE: 3300B® platform supplied by ASML of Veldhoven, NL). This tool architecture allows for work pieces, such as substrates with deposited metal oxide-containing films, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

Airlock 442 may be an "outgoing" loadlock, referring to the transfer of a substrate out from the VTM 438 serving a deposition module 420a to the patterning module 440, and airlock 446 may be an "ingoing" loadlock, referring to the transfer of a substrate from the patterning module 440 back in to the VTM 438. The ingoing loadlock 446 may also provide an interface to the exterior of the tool for access and egress of substrates. Each process module has a facet that interfaces the module to VTM 438. For example, deposition process module 420a has facet 436. Inside each facet, sensors, for example, sensors 1-18 as shown, are used to detect the passing of wafer 426 when moved between respective stations. Patterning module 440 and airlocks 442 and 446 may be similarly equipped with additional facets and sensors, not shown.

Main VTM robot 422 transfers wafer 426 between modules, including airlocks 442 and 446. In one embodiment, robot 422 has one arm, and in another embodiment, robot 422 has two arms, where each arm has an end effector 424 to pick wafers such as wafer 426 for transport. Front-end robot 444, in is used to transfer wafers 426 from outgoing airlock 442 into the patterning module 440, from the patterning module 440 into ingoing airlock 446. Front-end robot 444 may also transport wafers 426 between the ingoing loadlock and the exterior of the tool for access and egress of substrates. Because ingoing airlock module 446 has the ability to match the environment between atmospheric and vacuum, the wafer 426 is able to move between the two pressure environments without being damaged.

It should be noted that a EUVL tool typically operates at a higher vacuum than a deposition tool. If this is the case, it is desirable to increase the vacuum environment of the substrate during the transfer from the deposition to the patterning tool to allow the substrate and deposited metal-containing film to degas prior to entry into the patterning tool. Outgoing airlock 442 may provide this function by holding the transferred wafers at a lower pressure, no higher than the pressure in the patterning module 440, for a period of time and exhausting any off-gassing, so that the optics of the patterning tool 440 are not contaminated by off-gassing from the substrate. A suitable pressure for the outgoing, off-gassing airlock is no more than 1E-8 Torr.

In some embodiments, a system controller 450 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 450 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored as code on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for deposition, patterning and/or development phases may be included in a corresponding recipe phase, for example.

Conclusion

EUV-sensitive metal oxide-containing films may be vapor-deposited on a semiconductor substrate. Such a metal oxide-containing film can then then patterned directly by EUV exposure in a vacuum ambient, and the pattern developed to form the metal oxide-containing hardmask. In this way, a metal oxide-containing hardmask formation process that combines steps of film formation by vapor deposition and optical lithography with the result of direct photopatterning of metal oxide-containing hardmasks at substantially reduced cost is provided.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the appended claims.

What is claimed is:

1. A method of forming a metal oxide-containing hardmask, comprising:
   depositing on a semiconductor substrate by a vapor-based deposition process a EUV-sensitive metalorganic oxide film, wherein the depositing comprises reaction of an organotin oxide precursor with carbon monoxide or dioxide in a RF plasma;
   exposing a portion of the metalorganic oxide film to EUV to form a pattern in the metalorganic oxide film;
   developing the pattern in the metalorganic oxide film to remove one of the exposed or an unexposed portion of the metalorganic oxide film to form the metal oxide-containing hardmask.

2. The method of claim 1, wherein the deposition is conducted by PECVD or PEALD.

3. The method of claim 1, wherein the exposed portion of the metalorganic oxide film is removed.

4. The method of claim 1, wherein the unexposed portion of the metalorganic oxide film is removed.

5. The method of claim 1, wherein the depositing comprises organotin oxide deposition precursors selected from the group consisting of halo alkyl Sn, alkoxy alkyl Sn and amido alkyl Sn.

6. The method of claim 5, wherein the deposition precursors are selected from the group consisting of trimethyl tin chloride, dimethyletin dichloride, methyltin trichloride, tris (dimethylamino)methyl tin(IV) and (dimethylamino)trimethyl tin(IV).

7. The method of claim 1, wherein the depositing comprises reaction of the organotin oxide with carbon dioxide in a RF plasma.

8. The method of claim 7, wherein the deposited organotin oxide film comprises $CH_3Sn(SnO)_3$ formed by CVD of $Sn(Cl)_3CH_3$ with carbon dioxide in a RF plasma.

9. The method of claim 8, wherein the EUV exposure causes a dimerization reaction in the exposed portion of the deposited organotin oxide film.

10. The method of claim 9, wherein the deposited organotin oxide film comprises $CH_3Sn(SnO)_3$ and the dimerization upon EUV exposure produces $Sn_2((SnO)_3)_2)$.

11. The method of claim 10, wherein, in the development, the Sn2((SnO)3)2 exposed portion is removed.

12. The method of claim 11, wherein the $Sn_2((SnO)_3)_2$ exposed portion is removed by ethanol and water in the development.

13. The method of claim 10, wherein, in the development, the unexposed portion of the deposited organotin oxide film is removed and the $Sn_2((SnO)_3)_2$ exposed portion remains.

14. The method of claim 1, wherein the exposing provides patterning of the metal oxide-containing film directly by EUV exposure in a vacuum ambient, without the use of photoresist, followed by developing to form the metal oxide-containing hardmask.

15. The method of claim 1, wherein the semiconductor substrate is a silicon wafer including partially-formed integrated circuits, and further comprising:
   prior to the deposition, providing the semiconductor substrate in a first reactor chamber for metal oxide-containing film deposition; and
   following deposition, transferring the substrate under vacuum to a lithography processing chamber for patterning.

16. An apparatus for conducting metal oxide-containing hardmask formation, the apparatus comprising:
   a metalorganic oxide film vapor-based deposition module;
   a metalorganic oxide film patterning module;
   a vacuum transfer module connecting the deposition module and the patterning module; and
   a controller including instructions for conducting metal oxide-containing hardmask formation, the instructions comprising code for:
   in the metal oxide-containing film vapor-based deposition module, depositing on a semiconductor substrate by a vapor-based deposition process a EUV-sensitive metalorganic oxide film, wherein the depositing comprises reaction of an organotin oxide precursor with carbon monoxide or dioxide in a RF plasma;
   transferring the substrate under vacuum to the metal oxide-containing film patterning module;
   in the metal oxide-containing film patterning module, patterning the metalorganic oxide film directly by EUV exposure in a vacuum ambient to form a pattern; and
   developing the pattern to form the metal oxide-containing hardmask.

17. The apparatus of claim 16, wherein:
   the deposition module comprises reactor chamber for vapor-depositing a photosensitive organotin oxide film; and
   the patterning module comprises a photolithography tool with a source of sub-30 nm wavelength radiation.

18. The apparatus of claim 17, wherein the deposition module is a PECVD tool.

19. The apparatus of claim 18, wherein the patterning module is a EUV lithography tool.

20. The apparatus of claim 19, wherein the instructions further comprise code for transferring the substrate outside the EUV lithography tool to conduct the pattern development.

\* \* \* \* \*